(12) United States Patent
Mishra et al.

(10) Patent No.: US 8,742,459 B2
(45) Date of Patent: Jun. 3, 2014

(54) HIGH VOLTAGE III-NITRIDE SEMICONDUCTOR DEVICES

(75) Inventors: Umesh Mishra, Montecito, CA (US); Lee McCarthy, Santa Barbara, CA (US); Nicholas Fichtenbaum, Santa Barbara, CA (US)

(73) Assignee: Transphorm Inc., Goleta, CA (US)

( * ) Notice: Subject to any disclaimer, the term of this patent is extended or adjusted under 35 U.S.C. 154(b) by 332 days.

(21) Appl. No.: 12/465,968

(22) Filed: May 14, 2009

(65) Prior Publication Data

US 2010/0289067 A1 Nov. 18, 2010

(51) Int. Cl.
*H01L 29/66* (2006.01)

(52) U.S. Cl.
USPC ............. 257/194; 257/E29.246; 257/E29.247

(58) Field of Classification Search
USPC ............ 257/20, 190, 194, 471, 476, E29.246, 257/E29.247; 438/167, 171, 172; 1/20, 190, 1/194, 471, 476, E29.246, E29.247
See application file for complete search history.

(56) References Cited

U.S. PATENT DOCUMENTS

| | | |
|---|---|---|
| 4,300,091 A | 11/1981 | Schade, Jr. |
| 4,645,562 A | 2/1987 | Liao et al. |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A * | 1/1998 | Kashiwa et al. .............. 257/476 |
| 5,714,393 A | 2/1998 | Wild et al. |
| 5,909,103 A | 6/1999 | Williams |
| 5,998,810 A * | 12/1999 | Hatano et al. ................. 257/102 |
| 6,008,684 A | 12/1999 | Ker et al. |
| 6,097,046 A | 8/2000 | Plumton |
| 6,100,571 A | 8/2000 | Mizuta et al. |

(Continued)

FOREIGN PATENT DOCUMENTS

| | | |
|---|---|---|
| CN | 1599960 | 3/2005 |
| CN | 1748320 A | 3/2006 |

(Continued)

OTHER PUBLICATIONS

Palacios et al. ("AlGaN/GaN HEMTs with an InGaN-based Back-barrier", Device Research Conference Digest, 200. DRC '05 $63^{rd}$, pp. 181-182, Jun. 2005).*

(Continued)

*Primary Examiner* — Yu-Hsi D Sun
(74) *Attorney, Agent, or Firm* — Fish & Richardson P.C.

(57) ABSTRACT

A III-N device is described has a buffer layer, a first III-N material layer on the buffer layer, a second III-N material layer on the first III-N material layer on an opposite side from the buffer layer and a dispersion blocking layer between the buffer layer and the channel layer. The first III-N material layer is a channel layer and a compositional difference between the first III-N material layer and the second III-N material layer induces a 2DEG channel in the first III-N material layer. A sheet or a distribution of negative charge at an interface of the channel layer and the dispersion blocking layer confines electrons away from the buffer layer.

33 Claims, 9 Drawing Sheets

(56) References Cited

U.S. PATENT DOCUMENTS

| | | | |
|---|---|---|---|
| 6,316,793 B1 | 11/2001 | Sheppard et al. | |
| 6,373,082 B1 | 4/2002 | Ohno et al. | |
| 6,475,889 B1 | 11/2002 | Ring | |
| 6,486,502 B1 | 11/2002 | Sheppard et al. | |
| 6,504,235 B2 | 1/2003 | Schmitz et al. | |
| 6,515,303 B2 | 2/2003 | Ring | |
| 6,548,333 B2 | 4/2003 | Smith | |
| 6,583,454 B2 | 6/2003 | Sheppard et al. | |
| 6,586,781 B2 | 7/2003 | Wu et al. | |
| 6,649,497 B2 | 11/2003 | Ring | |
| 6,727,531 B1 | 4/2004 | Redwing et al. | |
| 6,777,278 B2 | 8/2004 | Smith | |
| 6,849,882 B2 | 2/2005 | Chavarkar et al. | |
| 6,867,078 B1 | 3/2005 | Green et al. | |
| 6,946,739 B2 | 9/2005 | Ring | |
| 6,979,863 B2 | 12/2005 | Ryu | |
| 6,982,204 B2 | 1/2006 | Saxler et al. | |
| 7,030,428 B2 * | 4/2006 | Saxler | 257/194 |
| 7,045,404 B2 | 5/2006 | Sheppard et al. | |
| 7,071,498 B2 | 7/2006 | Johnson et al. | |
| 7,084,475 B2 | 8/2006 | Shelton et al. | |
| 7,125,786 B2 | 10/2006 | Ring et al. | |
| 7,126,212 B2 | 10/2006 | Enquist et al. | |
| 7,161,194 B2 | 1/2007 | Parikh et al. | |
| 7,170,111 B2 | 1/2007 | Saxler | |
| 7,230,284 B2 | 6/2007 | Parikh et al. | |
| 7,238,560 B2 | 7/2007 | Sheppard et al. | |
| 7,253,454 B2 | 8/2007 | Saxler | |
| 7,265,399 B2 | 9/2007 | Sriram et al. | |
| 7,268,375 B2 | 9/2007 | Shur et al. | |
| 7,304,331 B2 | 12/2007 | Saito et al. | |
| 7,321,132 B2 * | 1/2008 | Robinson et al. | 257/12 |
| 7,326,971 B2 | 2/2008 | Harris et al. | |
| 7,332,795 B2 | 2/2008 | Smith et al. | |
| 7,364,988 B2 | 4/2008 | Harris et al. | |
| 7,388,236 B2 | 6/2008 | Wu et al. | |
| 7,419,892 B2 | 9/2008 | Sheppard et al. | |
| 7,432,142 B2 | 10/2008 | Saxler et al. | |
| 7,456,443 B2 | 11/2008 | Saxler et al. | |
| 7,465,967 B2 | 12/2008 | Smith et al. | |
| 7,501,669 B2 | 3/2009 | Parikh et al. | |
| 7,544,963 B2 | 6/2009 | Saxler | |
| 7,547,925 B2 | 6/2009 | Wong et al. | |
| 7,548,112 B2 | 6/2009 | Sheppard | |
| 7,550,783 B2 | 6/2009 | Wu et al. | |
| 7,550,784 B2 | 6/2009 | Saxler et al. | |
| 7,566,918 B2 | 7/2009 | Wu et al. | |
| 7,573,078 B2 | 8/2009 | Wu et al. | |
| 7,592,211 B2 | 9/2009 | Sheppard et al. | |
| 7,598,108 B2 | 10/2009 | Li et al. | |
| 7,612,390 B2 | 11/2009 | Saxler et al. | |
| 7,615,774 B2 | 11/2009 | Saxler | |
| 7,638,818 B2 | 12/2009 | Wu et al. | |
| 7,678,628 B2 | 3/2010 | Sheppard et al. | |
| 7,692,263 B2 | 4/2010 | Wu et al. | |
| 7,709,269 B2 | 5/2010 | Smith et al. | |
| 7,709,859 B2 | 5/2010 | Smith et al. | |
| 7,745,851 B2 | 6/2010 | Harris | |
| 7,755,108 B2 | 7/2010 | Kuraguchi | |
| 7,759,700 B2 | 7/2010 | Ueno et al. | |
| 7,777,252 B2 | 8/2010 | Sugimoto et al. | |
| 7,777,254 B2 | 8/2010 | Sato | |
| 7,795,642 B2 | 9/2010 | Suh et al. | |
| 7,812,369 B2 | 10/2010 | Chini et al. | |
| 7,855,401 B2 | 12/2010 | Sheppard et al. | |
| 7,875,537 B2 | 1/2011 | Suvorov et al. | |
| 7,875,914 B2 | 1/2011 | Sheppard | |
| 7,884,395 B2 | 2/2011 | Saito | |
| 7,892,974 B2 | 2/2011 | Ring et al. | |
| 7,893,500 B2 | 2/2011 | Wu et al. | |
| 7,898,004 B2 | 3/2011 | Wu et al. | |
| 7,901,994 B2 | 3/2011 | Saxler et al. | |
| 7,906,799 B2 | 3/2011 | Sheppard et al. | |
| 7,915,643 B2 | 3/2011 | Suh et al. | |
| 7,915,644 B2 | 3/2011 | Wu et al. | |
| 7,919,791 B2 | 4/2011 | Flynn et al. | |
| 7,928,475 B2 | 4/2011 | Parikh et al. | |
| 7,948,011 B2 | 5/2011 | Rajan et al. | |
| 7,955,918 B2 | 6/2011 | Wu et al. | |
| 7,960,756 B2 | 6/2011 | Sheppard et al. | |
| 7,965,126 B2 | 6/2011 | Honea et al. | |
| 7,985,986 B2 | 7/2011 | Heikman et al. | |
| 8,049,252 B2 | 11/2011 | Smith et al. | |
| 2001/0032999 A1 | 10/2001 | Yoshida | |
| 2001/0040247 A1 | 11/2001 | Ando et al. | |
| 2002/0036287 A1 | 3/2002 | Yu et al. | |
| 2002/0121648 A1 | 9/2002 | Hsu et al. | |
| 2002/0167023 A1 | 11/2002 | Chavarkar et al. | |
| 2003/0003724 A1 | 1/2003 | Uchiyama et al. | |
| 2003/0006437 A1 | 1/2003 | Mizuta et al. | |
| 2003/0020092 A1 | 1/2003 | Parikh et al. | |
| 2004/0041169 A1 | 3/2004 | Ren et al. | |
| 2004/0061129 A1 | 4/2004 | Saxler et al. | |
| 2004/0164347 A1 | 8/2004 | Zhao et al. | |
| 2005/0001235 A1 | 1/2005 | Murata et al. | |
| 2005/0077541 A1 | 4/2005 | Shen et al. | |
| 2005/0133816 A1 | 6/2005 | Fan et al. | |
| 2005/0189561 A1 | 9/2005 | Kinzer et al. | |
| 2005/0189562 A1 | 9/2005 | Kinzer et al. | |
| 2005/0194612 A1 | 9/2005 | Beach | |
| 2005/0253168 A1 | 11/2005 | Wu et al. | |
| 2005/0274977 A1 | 12/2005 | Saito et al. | |
| 2006/0011915 A1 | 1/2006 | Saito et al. | |
| 2006/0043499 A1 | 3/2006 | De Cremoux et al. | |
| 2006/0060871 A1 | 3/2006 | Beach | |
| 2006/0076677 A1 | 4/2006 | Daubenspeck et al. | |
| 2006/0102929 A1 | 5/2006 | Okamoto et al. | |
| 2006/0108602 A1 | 5/2006 | Tanimoto | |
| 2006/0108605 A1 | 5/2006 | Yanagihara et al. | |
| 2006/0121682 A1 | 6/2006 | Saxler | |
| 2006/0124962 A1 | 6/2006 | Ueda et al. | |
| 2006/0157729 A1 | 7/2006 | Ueno et al. | |
| 2006/0186422 A1 | 8/2006 | Gaska et al. | |
| 2006/0189109 A1 | 8/2006 | Fitzgerald | |
| 2006/0202272 A1 | 9/2006 | Wu et al. | |
| 2006/0220063 A1 | 10/2006 | Kurachi et al. | |
| 2006/0226442 A1 | 10/2006 | Zhang et al. | |
| 2006/0255364 A1 * | 11/2006 | Saxler et al. | 257/192 |
| 2006/0289901 A1 | 12/2006 | Sheppard et al. | |
| 2007/0007547 A1 * | 1/2007 | Beach | 257/201 |
| 2007/0018187 A1 * | 1/2007 | Lee et al. | 257/98 |
| 2007/0018199 A1 | 1/2007 | Sheppard et al. | |
| 2007/0018210 A1 | 1/2007 | Sheppard | |
| 2007/0045670 A1 | 3/2007 | Kuraguchi | |
| 2007/0080672 A1 | 4/2007 | Yang | |
| 2007/0128743 A1 | 6/2007 | Huang et al. | |
| 2007/0131968 A1 | 6/2007 | Morita et al. | |
| 2007/0132037 A1 | 6/2007 | Hoshi et al. | |
| 2007/0134834 A1 * | 6/2007 | Lee et al. | 438/46 |
| 2007/0145390 A1 | 6/2007 | Kuraguchi | |
| 2007/0145417 A1 | 6/2007 | Brar et al. | |
| 2007/0158692 A1 | 7/2007 | Nakayama et al. | |
| 2007/0164315 A1 | 7/2007 | Smith et al. | |
| 2007/0164322 A1 | 7/2007 | Smith et al. | |
| 2007/0194354 A1 | 8/2007 | Wu et al. | |
| 2007/0205433 A1 | 9/2007 | Parikh et al. | |
| 2007/0210329 A1 | 9/2007 | Goto | |
| 2007/0215899 A1 | 9/2007 | Herman | |
| 2007/0224710 A1 | 9/2007 | Palacios et al. | |
| 2007/0228477 A1 | 10/2007 | Suzuki et al. | |
| 2007/0241368 A1 | 10/2007 | Mil'shtein et al. | |
| 2007/0278518 A1 * | 12/2007 | Chen et al. | 257/192 |
| 2007/0295985 A1 | 12/2007 | Weeks, Jr. et al. | |
| 2008/0073670 A1 | 3/2008 | Yang et al. | |
| 2008/0093626 A1 | 4/2008 | Kuraguchi | |
| 2008/0121876 A1 | 5/2008 | Otsuka et al. | |
| 2008/0157121 A1 | 7/2008 | Ohki | |
| 2008/0203430 A1 | 8/2008 | Simin et al. | |
| 2008/0230784 A1 | 9/2008 | Murphy | |
| 2008/0237606 A1 * | 10/2008 | Kikkawa et al. | 257/76 |
| 2008/0237640 A1 | 10/2008 | Mishra et al. | |
| 2008/0274574 A1 * | 11/2008 | Yun | 438/47 |
| 2008/0283844 A1 | 11/2008 | Hoshi et al. | |
| 2008/0296618 A1 | 12/2008 | Suh et al. | |

(56) References Cited

U.S. PATENT DOCUMENTS

| | | | |
|---|---|---|---|
| 2008/0308813 A1 | 12/2008 | Suh et al. | |
| 2009/0001409 A1 | 1/2009 | Takano et al. | |
| 2009/0032820 A1 | 2/2009 | Chen | |
| 2009/0032879 A1 | 2/2009 | Kuraguchi | |
| 2009/0045438 A1* | 2/2009 | Inoue et al. | 257/192 |
| 2009/0050936 A1 | 2/2009 | Oka | |
| 2009/0065810 A1 | 3/2009 | Honea et al. | |
| 2009/0072240 A1 | 3/2009 | Suh et al. | |
| 2009/0072269 A1 | 3/2009 | Suh et al. | |
| 2009/0075455 A1 | 3/2009 | Mishra | |
| 2009/0085065 A1 | 4/2009 | Mishra et al. | |
| 2009/0121775 A1 | 5/2009 | Ueda et al. | |
| 2009/0140262 A1 | 6/2009 | Ohki et al. | |
| 2009/0146185 A1 | 6/2009 | Suh et al. | |
| 2009/0201072 A1 | 8/2009 | Honea et al. | |
| 2009/0218598 A1 | 9/2009 | Goto | |
| 2009/0267078 A1 | 10/2009 | Mishra et al. | |
| 2010/0019225 A1 | 1/2010 | Lee | |
| 2010/0019279 A1 | 1/2010 | Chen et al. | |
| 2010/0065923 A1 | 3/2010 | Charles et al. | |
| 2010/0067275 A1 | 3/2010 | Wang et al. | |
| 2010/0133506 A1 | 6/2010 | Nakanishi et al. | |
| 2010/0140660 A1 | 6/2010 | Wu et al. | |
| 2010/0201439 A1 | 8/2010 | Wu et al. | |
| 2010/0203234 A1 | 8/2010 | Anderson et al. | |
| 2010/0219445 A1 | 9/2010 | Yokoyama et al. | |
| 2010/0244087 A1 | 9/2010 | Horie et al. | |
| 2010/0288998 A1 | 11/2010 | Kikuchi et al. | |
| 2011/0006346 A1* | 1/2011 | Ando et al. | 257/192 |
| 2011/0012110 A1 | 1/2011 | Sazawa et al. | |
| 2011/0249359 A1 | 10/2011 | Mochizuki et al. | |
| 2012/0168822 A1 | 7/2012 | Matsushita | |
| 2012/0193638 A1 | 8/2012 | Keller et al. | |
| 2012/0211800 A1 | 8/2012 | Boutros | |
| 2012/0217512 A1 | 8/2012 | Renaud | |
| 2012/0315445 A1 | 12/2012 | Mizuhara et al. | |

FOREIGN PATENT DOCUMENTS

| | | | |
|---|---|---|---|
| CN | 101107713 | | 1/2008 |
| CN | 101312207 | | 11/2008 |
| CN | 101897029 | A | 11/2010 |
| CN | 102017160 | A | 4/2011 |
| EP | 1 998 376 | A1 | 12/2008 |
| EP | 2 188 842 | | 5/2010 |
| JP | 11-224950 | | 8/1999 |
| JP | 2000-058871 | | 2/2000 |
| JP | 2003-229566 | | 8/2003 |
| JP | 2003-244943 | | 8/2003 |
| JP | 2004-260114 | A | 9/2004 |
| JP | 2006-32749 | A | 2/2006 |
| JP | 2006-033723 | A | 2/2006 |
| JP | 2007-036218 | A | 2/2007 |
| JP | 2007-215331 | | 8/2007 |
| JP | 2008-199771 | | 8/2008 |
| JP | 2010-087076 | | 4/2010 |
| JP | 2010-539712 | | 12/2010 |
| TW | 200924068 | | 6/2009 |
| TW | 200924201 | | 6/2009 |
| TW | 200947703 | | 11/2009 |
| TW | 201010076 | | 3/2010 |
| TW | 98132132 | | 7/2010 |
| TW | 201027759 | | 7/2010 |
| TW | 99103836 | | 10/2010 |
| WO | WO 2004/070791 | | 8/2004 |
| WO | WO 2004/098060 | | 11/2004 |
| WO | WO 2005/070007 | | 8/2005 |
| WO | WO 2005/070009 | | 8/2005 |
| WO | WO 2006/114883 | | 11/2006 |
| WO | WO2007077666 | | 7/2007 |
| WO | WO 2007077666 A1 * | 7/2007 | H01L 29/205 |
| WO | WO 2007/108404 | | 9/2007 |
| WO | WO 2008/120094 | | 10/2008 |
| WO | WO 2009/036181 | | 3/2009 |
| WO | WO 2009/036266 | | 3/2009 |
| WO | WO 2009/039028 | | 3/2009 |
| WO | WO 2009/039041 | | 3/2009 |
| WO | WO 2009/076076 | | 6/2009 |
| WO | WO 2009/132039 | | 10/2009 |
| WO | WO 2010-039463 | | 4/2010 |
| WO | WO 2010/068554 | | 6/2010 |
| WO | WO 2010/090885 | | 8/2010 |
| WO | WO 2010/132587 | | 11/2010 |
| WO | WO 2011/031431 | | 3/2011 |
| WO | WO 2011/072027 | | 6/2011 |

OTHER PUBLICATIONS

Palacios et al. ("AlGaN/GaN High Electron Mobility Transistors With InGaN Back-Barriers", IEEE Electron Device Letters, vol. 27, No. 1, Jan. 2006).*
Authorized officer Sang Ho Lee, International Search Report and Written Opinion in PCT/US2010/034579, mailed Dec. 24, 2010, 9 pages.
Mishra et al., "Enhancement Mode III-N HEMTs", U.S. Appl. No. 12/108,449, filed Apr. 23, 2008, 58 pp.
Wu et al., "Semiconductor Heterostructure Diodes", U.S. Appl. No. 12/332,284, filed Dec. 10, 2008, 51 pp.
Suh et al., "Enhancement Mode Nitride Power Devices", U.S. Appl. No. 11/856,687, filed Sep. 17, 2007, 58 pp.
Suh et al., "III-Nitride Devices with Recessed Gates", U.S. Appl. No. 12/102,340, filed Apr. 14, 2008, 29 pp.
Suh et al., "Insulated Gate E-Mode Transistors", U.S. Appl. No. 12/324,574, filed Nov. 26, 2008, 43 pp.
Wu et al., "III-Nitride Devices and Circuits", U.S. Appl. No. 12/368,248, filed Feb. 9, 2009, 28 pp.
Suh et al.. "Gallium Nitride Diodes and Integrated Components", U.S. Appl. No. 11/856,695, filed Nov. 17, 2007, 33 pp.
Authorized officer Keon Hyeong Kim, International Search Report and Written Opinion in PCT/US2008/076160, mailed Mar. 18, 2009, 11 pages.
Authorized officer Sung Hee Kim, International Search Report and Written Opinion in PCT/US2009/057554, mailed May 10, 2010, 13 pages.
Authorized officer Gijsbertus Beijer, International Preliminary Report on Patentability in PCT/US2009/057554, mailed Apr. 7, 2011, 7 pages.
Authorized officer Sung Chan Chung, International Search Report and Written Opinion in PCT/US2010/021824, mailed Aug. 23, 2010, 9 pages.
Wang et al., "Enhancement-Mode $Si_3N_4$/AlGaN/GaN MISHFETs," IEEE Electron Device Letters, 2006, 27(10):793-795.
Mishra et al., "Polarization-induced barriers for n-face nitride-based electronics," U.S. Appl. No. 60/940,052, filed May 24, 2007, 29 pages.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.
Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Mishra et al., "N-face high electron mobility transistors with low buffer leakage and low parasitic resistance," U.S. Appl. No. 60/908,914, filed Mar. 29 ,2007, 21 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.

(56) References Cited

OTHER PUBLICATIONS

Authorized officer Chung Keun Lee, International Search Report and Written Opinion in PCT/US2009/076030, mailed Mar. 23, 2009, 10 pages.
Authorized officer Yolaine Cussac, International Preliminary Report on Patentability in PCT/US2009/076030, Mar. 25, 2010, 5 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
SIPO First Office Action for Application No. 200880120050.6, Aug. 2, 2011, 8 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability in PCT/US2009/041304, mailed Nov. 4, 2010, 8 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sang Ho Lee, International Search Report and Written Opinion in PCT/US2010/059486, mailed Jul. 26, 2011, 9 pages.
Authorized officer Jeongmin Choi, International Search Report and Written Opinion in PCT/US2010046193, mailed Apr. 26, 2011, 13 pages.
Mishra et al., "AlGaN/GaN HEMTs—an overview of device operation and applications," Proceedings of the IEEE 2002, 90(6):1022-1031.
Kumar et al., "High transconductance enhancement-mode AlGaN/GaN HEMTs on SiC substrate," Electronics Letters, Nov. 27, 2003, 39(24):1758-1760.
Rajan et al., "Advanced transistor structures based on N-face GaN," 32M International Symposium on Compound Semiconductors (ISCS), Sep. 18-22, 2005, Europa-Park Rust, Germany, 2 pages.
Shelton et al., "Selective area growth and characterization of AlGaN/GaN heterojunction bipolar transistors by metalorganic chemical vapor deposition," IEEE Transactions on Electron Devices, 2001, 48(3):490-494.
Green et al., "The effect of surface passivation on the microwave characteristics of un doped AlGaN/GaN HEMT's," IEEE Electron Device Letters, Jun. 2000, 21(6):268-270.
Karmalkar and Mishra, "Very high voltage AlGaN/GaN high electron mobility transistors using a field plate deposited on a stepped insulator," Solid-State Electronics, 2001, 45:1645-1652.
Ando et al., "10-W/mm AlGaN-GaN HFET with a field modulating plate," IEEE Electron Device Letters, 2003, 24(5):289-291.
Khan et al., "AlGaN/GaN metal oxide semiconductor heterostructure field effect transistor," IEEE Electron Device Letters, 2000, 21(2):63-65.
Rajan et al., "Method for Heteroepitaxial growth of high quality N-Face GaN, InN and AlN and their alloys by metal organic chemical vapor deposition," U.S. Appl. No. 60/866,035, filed Nov. 15, 2006, 31 pages.
Mishra et al., "N-face high electron mobility transistors with low buffer leakage and low parasitic resistance," U.S. Appl. No. 60/908,914, filed Mar. 29, 2007, 21 pages.
Lanford et al., "Recessed-gate enhancement-mode GaN HEMT with high threshold voltage", Mar. 31, 2005, Electronics Letters, vol. 41, No. 7, 2 pages, Online No. 20050161.
Saito et al., "Recess-gate structure approach toward normally off high-voltage AlGaN/GaN HEMT for power electronics applications," Feb. 2006, IEEE Transactions on Electron Device, 53(2):356-362.

Suh et al., "High breakdown enhancement mode GaN-based HEMTs with integrated slant field plate," U.S. Appl. No. 60/822,886, filed Aug. 18, 2006, 16 pp.
Suh et al., "III-nitride devices with recessed gates," U.S. Appl. No. 60/972,481, filed Sep. 14, 2007, 18 pp.
Mishra et al., "Growing N-polar III-nitride structures," U.S. Appl. No. 60/972,467, filed Sep. 14, 2007, 7 pp.
Dora et al., "ZrO$_2$ gate dielectrics produced by ultraviolet ozone oxidation for GaN and AlGaN/GaN transistors," Mar./Apr. 2006, J. Vac. Sci. Technol. B, 24(2)575-581.
Gu et al., "AlGaN/GaN MOS transistors using crystalline ZrO$_2$ as gate dielectric," 2007, Proceedings of SPIE, vol. 6473, 64730S-1-8.
Sugiura et al., "Enhancement-mode n-channel GaN MOSFETs fabricated on $p$-GaN using Hf0$_2$ as gate oxide," Aug. 16, 2007, Electronics Letters, vol. 43, No. 17, 2 pp.
Wang et al., "Comparison of the effect of gate dielectric layer on 2DEG carrier concentration in strained AlGaN/GaN heterostructure," 2005, Mater. Res. Soc. Symp. Proc., vol. 831, 6 pp.
Fanciulli et al., "Structural and electrical properties of Hf0$_2$ films grown by atomic layer deposition on Si, Ge, GaAs and GaN," 2004, Mat. Res. Soc. Symp. Proc., vol. 786, 6 pp.
Coffie, R.L., Characterizing and suppressing DC-to-RF dispersion in AlGaN/GaN high electron mobility transistors, 2003, PhD Thesis, University of California, Santa Barbara, 169 pp.
Keller, et al. (2002), "GaN-GaN junctions with ultrathin AlN interlayers: expanding heterojunction design," Applied Physics Letters, 80(23):4387-4389.
Palacios, et al. (2006), "Nitride-based high electron mobility transistors with a GaN spacer," Applied Physics Letters, 89:073508-1-3.
Kuraguchi et al. (2007), "Normally-off GaN-MISFET with well-controlled threshold voltage," Phys. Stats. Sol., 204(6):2010-2013.
Ota and Nozawa (2008), "AlGaN/GaN recessed MIS-Gate HFET with high threshold-voltage normally-off operation for power electronics applications," IEEE Electron Device Letters, 29(7):668-670.
Chen et al., "High-performance AlGaN/GaN lateral field-effect rectifiers compatible with high electron mobility transistors," Jun. 25, 2008, Applied Physics Letters, 92, 253501-1-3.
Dora et al., "High breakdown voltage achieved on AlGaN/GaN HEMTs with integrated slant field plates", Sep. 9, 006, IEEE Electron Device Letters, 27(9):713-715.
Coffie et al. (2003), "Unpassivated $p$-GaN/AlGaN/GaN HEMTs with 7.1 W/mm at 10 GhZ," Electronic Letters, 39(19):1419-1420.
Karmalkar and Mishra (2001), "Enhancement of breakdown voltage in AlGaN/GaN high electron mobility transistors using a field plate," IEEE Transactions on Electron Devices, 48(8):1515-1521.
Lee et al. (2001), "Self-aligned process for emitter- and base-regrowth GaN HBTs and BJTs," Solid-State Electronics, 45:243-247.
Yoshida, S., "AlGan/GaN power FET" Furukawa Review, 21:7-11, 2002.
Arulkumaran et al. (2005), "Enhancement of breakdown voltage by AlN buffer layer thickness in AlGaN/GaN high-electron-mobility transistors on 4 in. diameter silicon," Applied Physics Letters, 86:123503-1-3.
Barnett and Shinn (1994), "Plastic and elastic properties of compositionally modulated thin films," Annu. Rev. Mater. Sci., 24:481-511.
Cheng et al. (2006), "Flat GaN epitaxial layers grown on Si(111) by metalorganic vapor phase epitaxy using step-graded AlGaN intermediate layers," Journal of Electronic Materials, 35(4):592-598.
Marchand et al. (2001), "Metalorganic chemical vapor deposition of GaN on Si(111): stress control and application to field-effect transistors," Journal of Applied Physics, 89(12):7846-7851.
Reiher et al. (2003), "Efficient stress relief in GaN heteroepitaxy on SiC (111) using low-temperature AlN interlayers," Journal of Crystal Growth, 248:563-567.
Shen, L., "Advanced polarization-based design of AlGaN/GaN HEMTs," Jun. 2004, PhD Thesis, University of California, Santa Barbara, 191 pp.
Authorized officer Nora Lindner, International Preliminary Report on Patentability in PCT/US2010/034579, mailed Nov. 24, 2011, 7 pages.

(56) References Cited

OTHER PUBLICATIONS

Authorized officer Philippe Bécamel, International Preliminary Report on Patentability in PCT/US2010/046193, mailed Mar. 8, 2012, 10 pages.
Arulkumaran, et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Chu, et al., "1200-V Normally Off GaN-on-Si Field-Effect Transistors with Low Dynamic On-Resistance," IEEE Electron Device Letters, 2001, 32(5):632-634.
Dora, "Understanding Material and Process Limits for High Breakdown Voltage AlGaN/GaN HEMTs," Dissertation, University of California, Santa Barbara, Mar. 2006, 157 pages.
Higashiwaki, et al., "AlGaN/GaN Heterostructure Field-Effect Transistors on 4H-SiC Substrates with Current-Gain Cutoff Frequency of 190 GHz," Applied Physics Express, 2008, 1:021103-1-3.
Hwang, et al., "Effects of a Molecular Beam Epitaxy Grown AlN Passivation Layer on AlGaN/GaN Heterojunction Field Effect Transistors," Solid-State Electronics, 2004, 48:363-366.
Im, et al., "Normally Off GaN MOSFET Based on AlGaN/GaN Heterostructure with Extremely High 2DEG Density Grown on Silicon Substrate," IEEE Electron Device Letters, 2010, 31(3):192-194.
Kim, "Process Development and Device Characteristics of AlGaN/GaN HEMTs for High Frequency Applications," Dissertation, University of Illinois at Urbana-Champaign, 2007, 120 pages.
Nanjo, et al., "Remarkable Breakdown Voltage Enhancement in AlGaN Channel High Electron Mobility Transistors," Applied Physics Letters, 2008, 92:263502-1-3.
Pei, et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 3 pages.
Suh, et al., "High-Breakdown Enhancement-Mode AlGaN/GaN HEMTs with Integrated Slant Field-Plate," Electron Devices Meeting, 2006, IEDM '06. International (2006), 3 pages.
Tipirneni, et al., "Silicon Dioxide-Encapsulated High-Voltage AlGaN/GaN HFETs for Power-Switching Applications," IEEE Electron Device Letters, 2007, 28(9):784-786.
Vetury, et al., "Direct Measurement of Gate Depletion in High Breakdown (405V) Al/GaN/GaN Heterostructure Field Effect Transistors," IEDM, 1998, 98:55-58.
Wu, et al., "A 97.8% Efficient GaN HEMT Boost Converter With 300-W Output Power at 1 MHz," IEEE Electron Device Letters, 2008, 29(8):824-826.
Wu, "AlGaN/GaN Micowave Power High-Mobility Transistors" Dissertation, University of California, Santa Barbara, Jul. 1997, 134 pages.
Zhang, "High Voltage GaN HEMTs with Low on-resistance for Switching Applications," Dissertation, University of California, Santa Barbara, Sep. 2002, 166 pages.
Authorized officer Kwan Sik Sul, International Search Report and Written Opinion in PCT/US2011/063975, mailed May 18, 2012, 8 pages.
Authorized officer Sang-Taek Kim, International Search Report and Written Opinion in PCT/US2011/061407, mailed May 22, 2012, 10 pages.
Authorized officer Kwan Sik Sul, International Search Report and Written Opinion in PCT/US2012/023160, mailed May 24, 2012, 9 pages.
Authorized officer Nora Lindner, International Preliminary Report on Patentability in PCT/US2010/059486, mailed Jun. 21, 2012, 6 pages.
Napierala, et al., Selective GaN Epitaxy on Si(111) Substrates Using Porous Aluminum Oxide Buffer Layers, J. Electrochem. Soc., 2006, 153(2):G125-127.
SIPO First Office Action for Application No. 200980114639.X, May 14, 2012, 13 pages.
TW Search Report and Action in Taiwan Invention Patent Application No. 098132132, issued Dec. 10, 2012, 8 pages.
Zhanghong Content, Shanghai Institute of Metallurgy, Chinese Academy of Sciences, "Two-dimensional Electron Gas and High Electron Mobility Transistor (HEMT)," Dec. 31, 1984, 17 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
European Search Report in EP 10 81 5813, mailed Mar. 12, 2013, 9 pages.
CN First Office Action for Application No. 201080030524.5, Oct. 28, 2013, 11 pages.

* cited by examiner

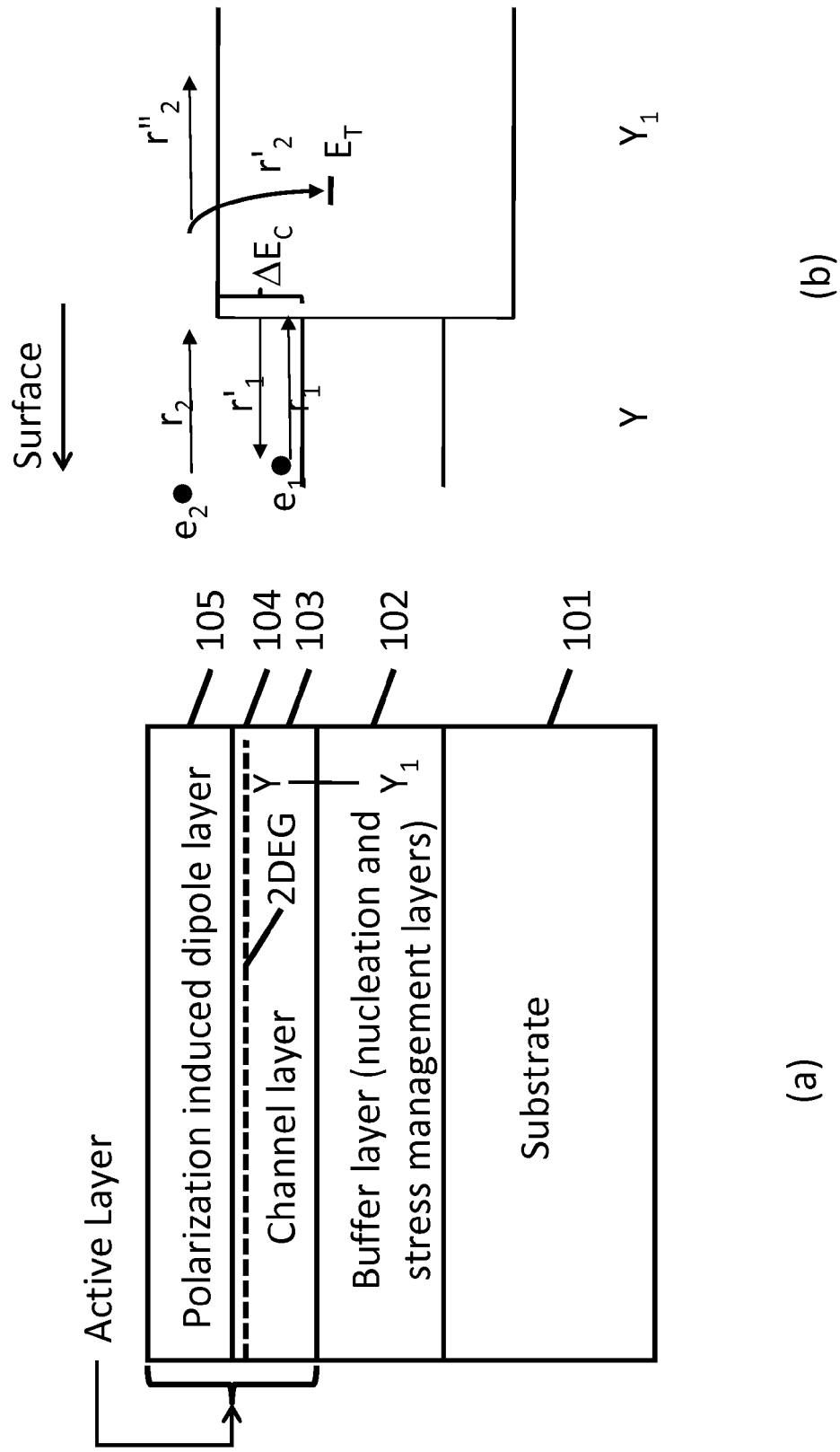
Fig. 1: Prior art

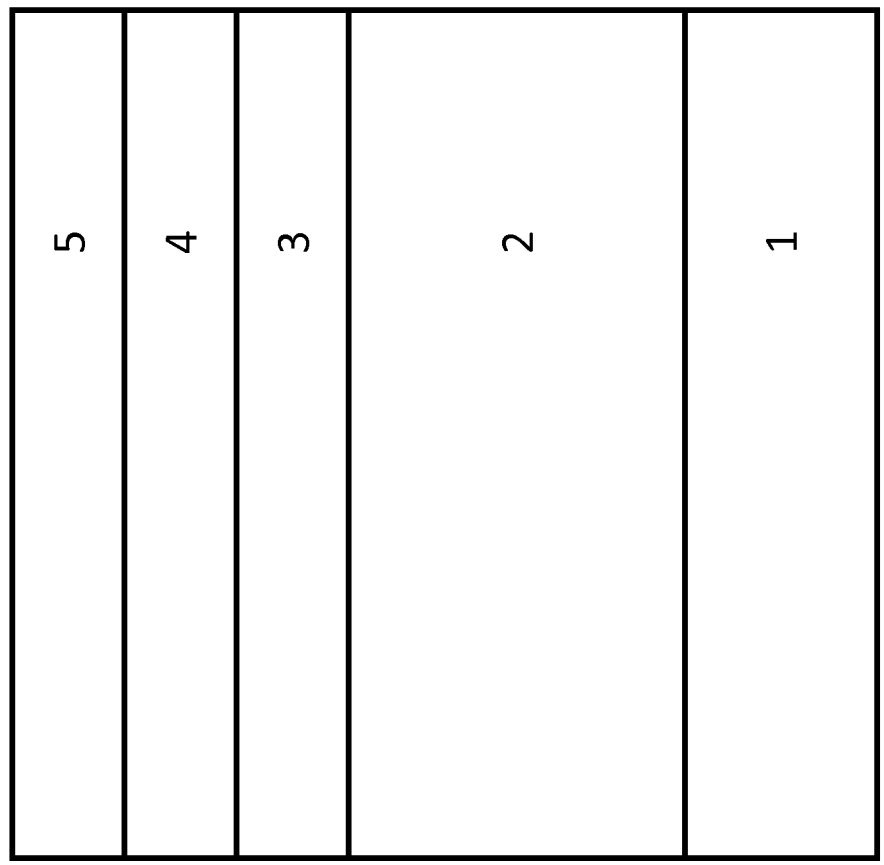

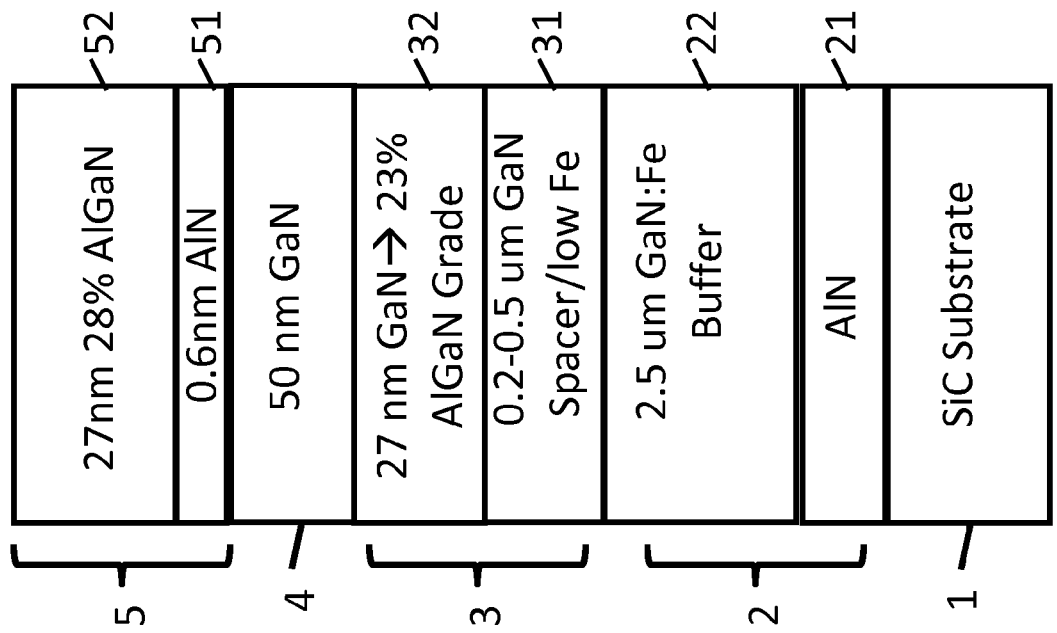
Fig. 3: Structure implemented

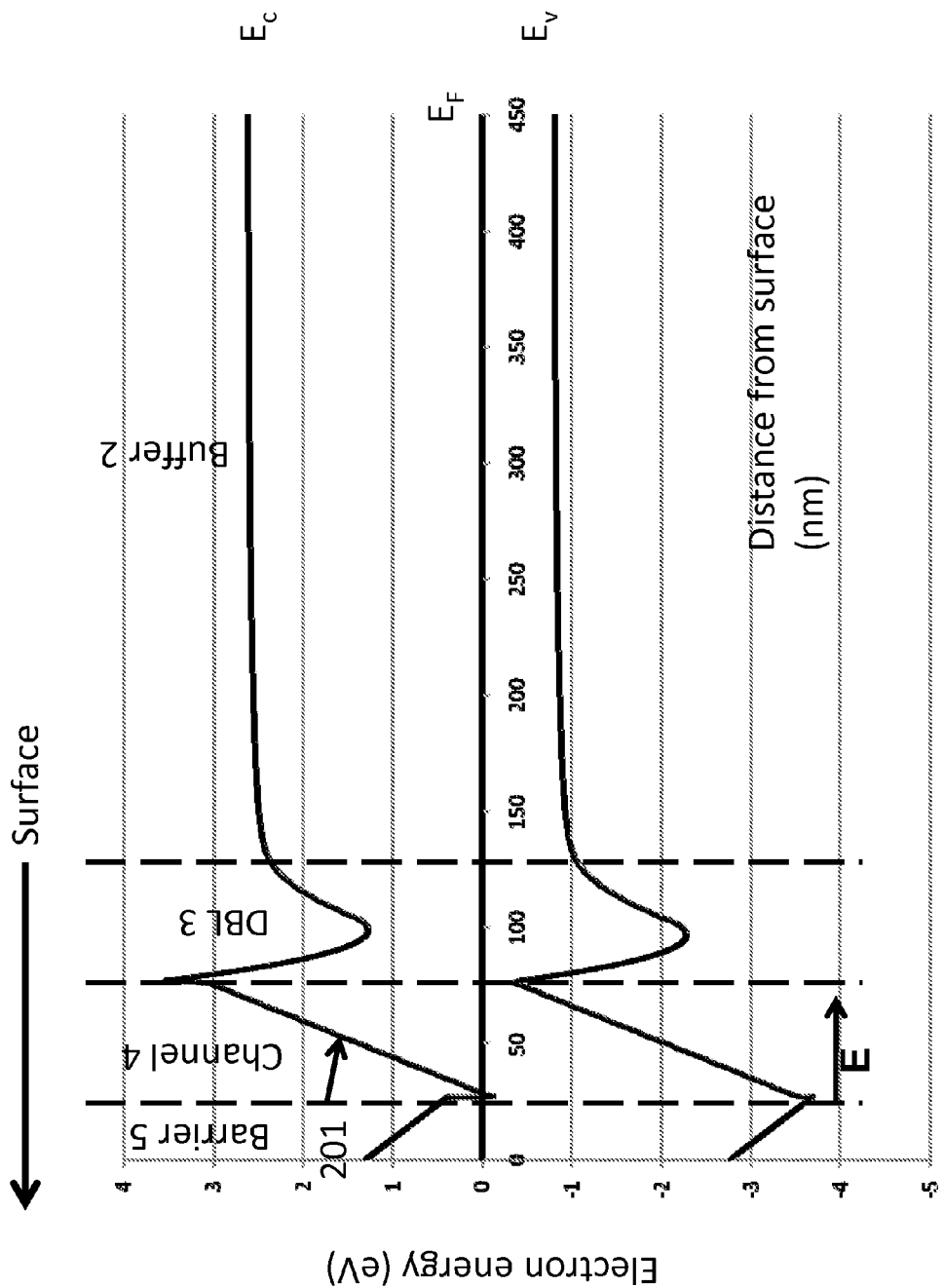
Fig. 4: Band diagram

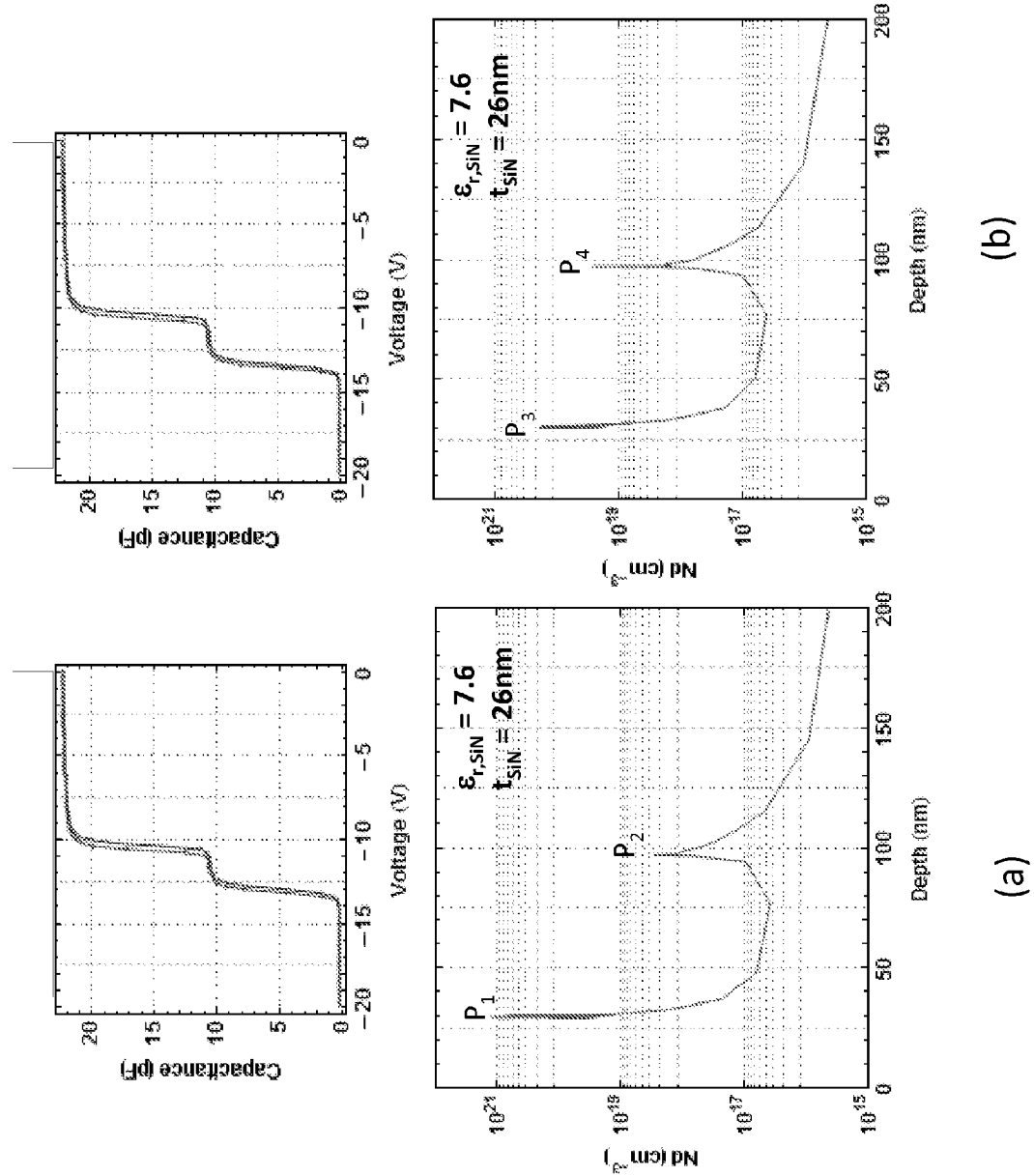
Fig. 6: CV & carrier profiles

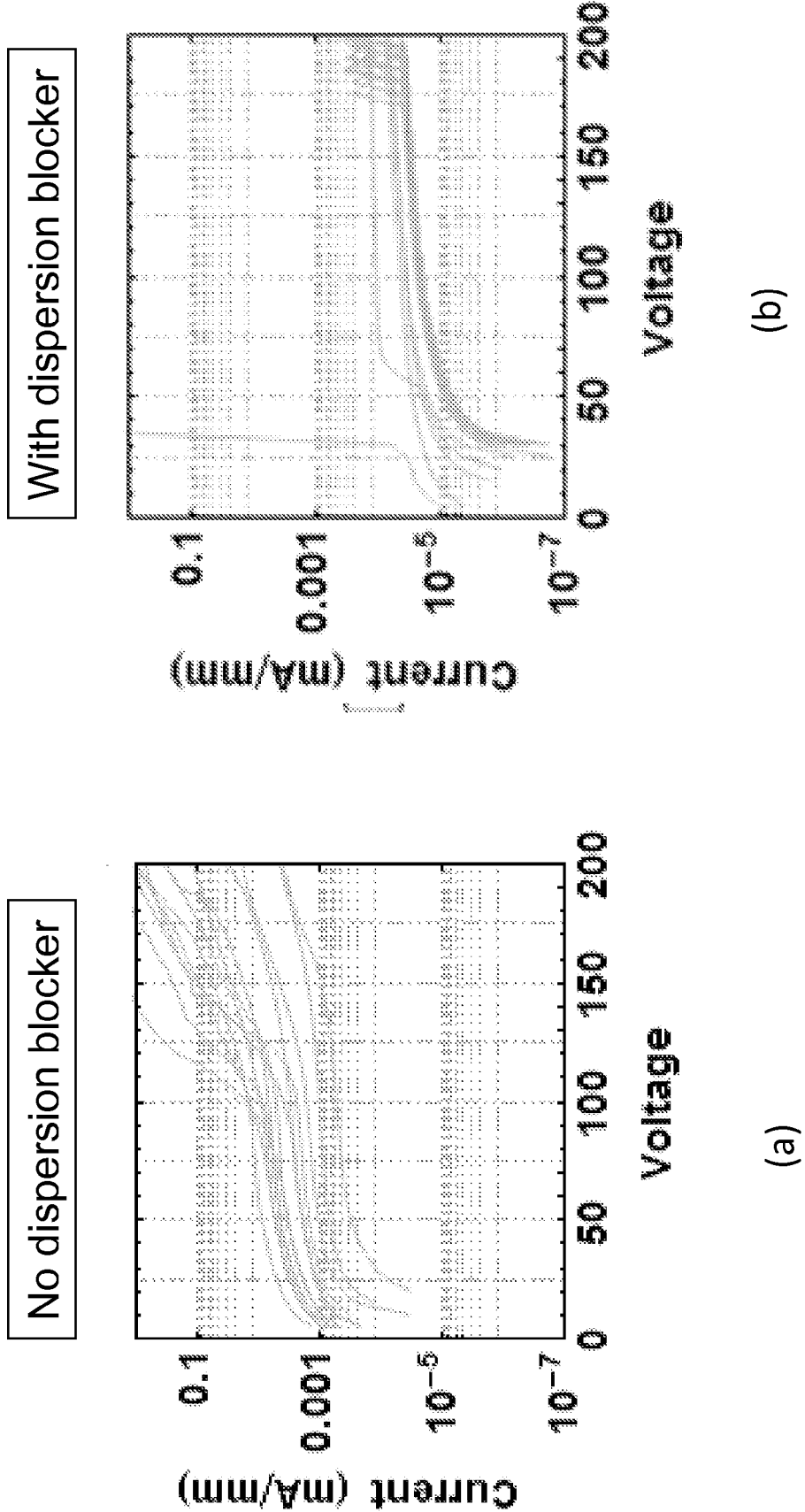
Fig. 7: Characteristics with devices biased OFF

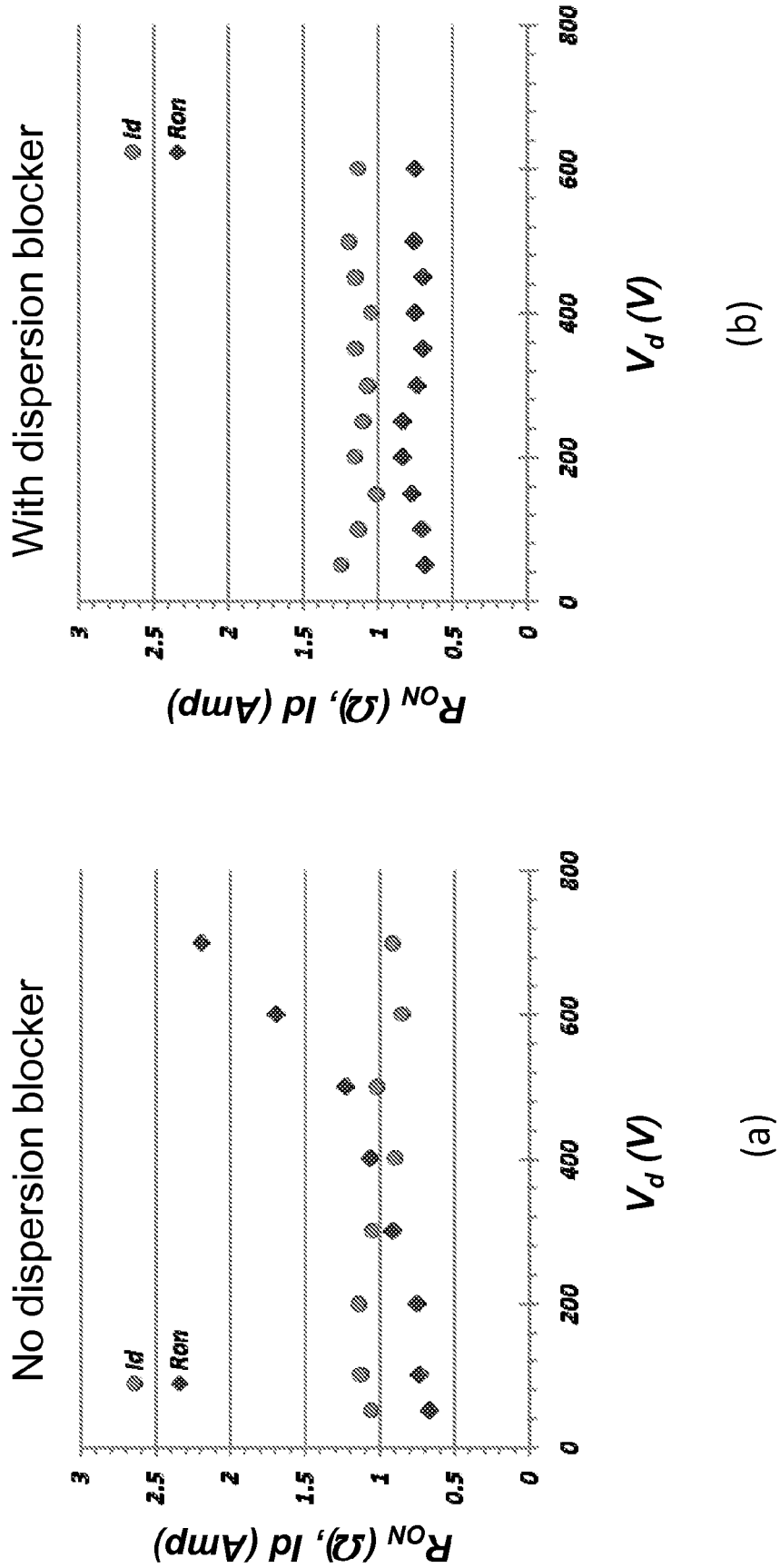
Fig. 8: Drain current and drain resistance

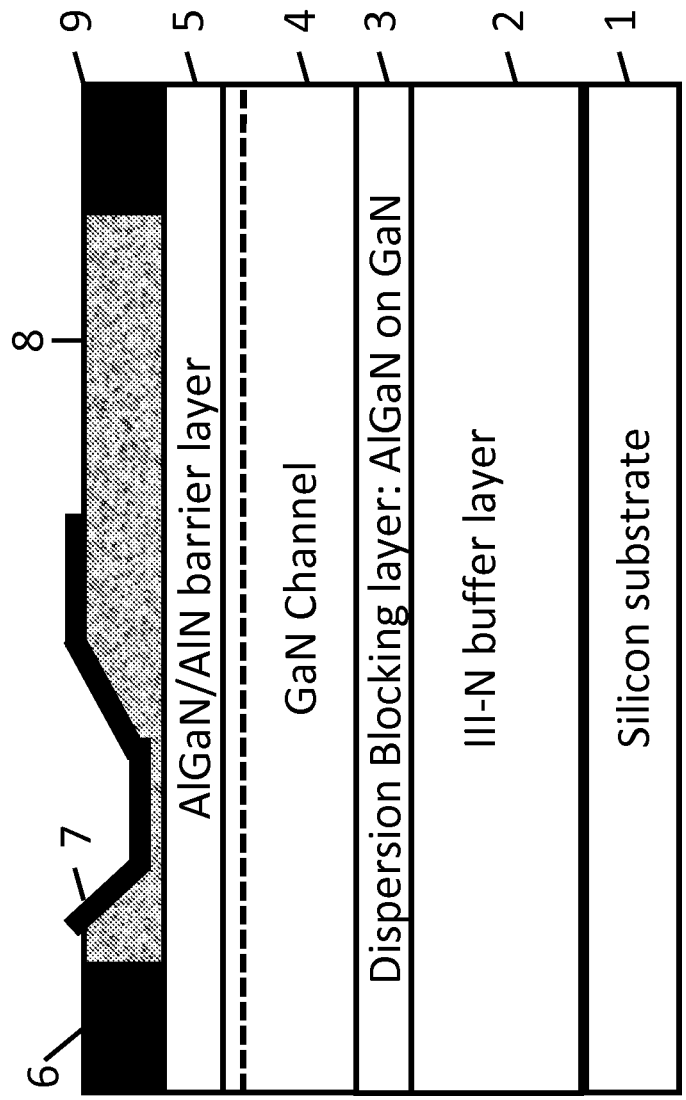
Fig. 9: III-nitride stack on silicon with a D-mode HEMT formed on it

HIGH VOLTAGE III-NITRIDE SEMICONDUCTOR DEVICES

TECHNICAL FIELD

This invention relates to semiconductor devices fabricated on group III-nitride semiconductors.

BACKGROUND

Group III-nitride based devices have many potential material advantages over silicon based devices for high power electronics applications. Amongst others, the advantages can include a larger band gap and breakdown field, high electron mobility in a two dimensional electron gas (2DEG) and low thermal generation current. However, large native substrates for group III-nitride semiconductors are not yet widely available. Currently, III-nitride films are grown by heteroepitaxy on suitable non-III-nitride substrates.

Substrates commonly used to support III-nitride films are silicon carbide, sapphire or silicon. Heteroepitaxy can be done with molecular beam epitaxy (MBE) or metal oxide chemical vapor deposition (MOCVD), and lately with hydride vapor phase epitaxy (HVPE). It can be difficult to grow high quality thick gallium nitride layers by heteroepitaxy; therefore, high voltage devices in gallium nitride are typically lateral devices with gallium nitride layers that are only a few microns thick. It can be difficult to accommodate a large voltage in a lateral device without spacing out the electrodes a relatively large distance. For a large blocking voltage across the source/gate and drain in a FET or across the anode and cathode in a diode, the spacing between the electrodes needed to sustain the voltage can be large. For example, a 1 kV device may have gate-drain electrode spacing of 10 μm or larger. This can cause high voltage lateral devices to have a larger area than an equivalent vertical device. Thus, substrate cost becomes an important issue commercially.

To reduce cost, silicon is the most desirable substrate for III-nitride layers. However, due to the large lattice and thermal mismatch between silicon and gallium nitride, it can be necessary to include nucleation and stress management layers in the device structures. These layers, often called the buffer layer and comprised of layers of $Al_xGa_{1-x}N$ that can include superlattices, can have a high density of threading dislocations and other extended defects, along with a multitude of point defects that act as deep traps or dopants. An appropriate buffer layer, even for a lattice mismatched substrate, can result in films of acceptable quality above the buffer layer. However, the layers within the buffer layer can have a high concentration of defect levels in the bandgap. The bandgap defect levels can cause dispersion or current collapse due to electron trapping in these layers, leakage at high drain biases due to carrier generation in these layers, and reduce the breakdown voltage of the device.

FIG. 1 shows an approach used to confine electrons to the channel. The III-nitride stack of FIG. 1(a) is for n-channel devices on the cation face, the preeminent form of III-nitride structure currently being used for fabricating HEMTs. The stack can be used to form a lateral device in which external biases modulate field and current in the active layer. The device structure includes a substrate 101 on which a buffer layer 102, which may include nucleation and stress management layers, is grown by heteroepitaxy. The active layer, which includes a channel layer 103 that has a 2DEG 104, is on the buffer layer 102. A barrier layer 105 whose dipole charge enables the formation of the 2DEG and confines the electrons to the channel layer is on an opposite side of the channel layer 103 from the buffer layer 102. Insulation and metallization layers are deposited and patterned to form the device (not shown).

Referring to FIG. 1(b), there can be a step in the conduction band edge ($\Delta E_C$) going from the channel layer to the buffer layer. As shown in the band diagram along the plane $YY_1$, a higher conduction band edge in the buffer layer can prevent carrier injection and trapping in the buffer layer as long as the barrier height is larger than the energy of the electrons impinging on it. Electron $e_1$ with energy less than the barrier height gets reflected back at the barrier (schematic trajectories $r_1$ and $r'_1$) while electron $e_2$ with energy greater than the barrier gets injected into the barrier where it could get trapped (schematic trajectory $r'_2$) or get collected by the substrate contact on the other side of the barrier (schematic trajectory $r''_2$). FIG. 1(b) only shows trapping processes in the buffer layer. However, the defects that form deep levels in the buffer layer also diffuse into the channel layer where they can readily trap electrons and cause current collapse.

SUMMARY

In one aspect, a III-N device is described that has a buffer layer, a first III-N material layer on the buffer layer, a second III-N material layer on the first III-N material layer on an opposite side from the buffer layer and a dispersion blocking layer between the buffer layer and the channel layer. The first III-N material layer is a channel layer and a compositional difference between the first III-N material layer and the second III-N material layer induces a 2DEG channel in the first III-N material layer. A sheet or a distribution of negative charge at an interface of the channel layer and the dispersion blocking layer confines electrons away from the buffer layer.

In another aspect, an integrate circuit is described. The circuit includes a III-N device, where the III-N device is an enhancement mode transistor or a depletion mode transistor and is electrically connected to one of a diode, resistor or capacitor.

Embodiments of the device may include one or more of the following features. The lowest conduction band minimum in the dispersion blocking layer can be higher than the highest occupied conduction band minimum in the channel layer. The dispersion blocking layer can be configured to confine electrons to the channel layer during device operation. The device can include a spacer layer between the dispersion blocking layer and the buffer layer. The dispersion blocking layer can have a greater concentration of aluminum than the spacer layer. The channel layer can consist of a first III-nitride alloy and the spacer layer consists of a second III-nitride alloy, wherein the first III-nitride alloy and the second III-nitride alloy have aluminum mole fractions within 10% of one another. The material of the channel layer can be unintentionally doped and the spacer layer can be compensated or over compensated. The spacer layer can consist of a III-nitride ternary alloy. The spacer layer can consist of $Al_xGa_{1-a}N$, $0 \le x \le 0.3$. The dispersion blocking layer can be a ternary III-nitride alloy layer with a sheet or layer of negative polarization charge adjacent to the channel layer. The dispersion blocking layer can comprise $Al_xIn_yGa_{1-x-y}N$, $y<x$ and $0<(x+y)<1$. A portion of the dispersion blocking layer that is closer to the channel layer than the buffer layer can have a higher aluminum composition than a portion of the dispersion blocking layer that is closer to the buffer layer. The dispersion blocking layer can have a graded aluminum concentration. The dispersion blocking layer can have a stepped aluminum concentration. The composition of the ternary III-nitride alloy layer can be graded and the ternary III-nitride alloy layer can be intentionally compensated. Fe, C, Mg, Zn or Be or any combination of acceptor or amphoteric dopants can compensate the III-nitride layer. The device can include a spacer layer that is doped with Fe, C, Mg, Zn or Be or any combination of acceptor or amphoteric dopants. The device can include a source contact, a drain contact and a gate, wherein the gate is adjacent to the second III-N material layer, the source contact and drain contact are in electrical contact with the 2DEG and the device is an enhancement mode FET. The device can include a source contact, a drain contact and a gate, wherein the gate is in contact with the second III-N material layer, the source contact and drain contact are in electrical contact with the 2DEG and the device is a depletion mode FET. The device can include an anode that forms a Schottky barrier with the III-nitride stack and a cathode in electrical contact with the 2DEG, wherein the device is a diode. When in operation, the device can have an on-resistance increase under switching operation at voltages above 300V that is less than 10%. In operation the device can have an on-resistance increase that is less than 5%. In operation the device can have operation has an on-resistance increase that is less than 2%. In operation the device can have an on-resistance increase under switching operation at voltages above 1200V that is less than 5%. The channel layer can have a thickness less than 1 micron, such as less than 0.5 micron or less than 0.05 micron. A combined thickness of all III-N layers can be about 2 micron or less and the device can exhibit less than 20% dispersion when used in an application where the device blocks at least 300V. A combined thickness of all III-N layers can be about 2.5 microns or less and the device can exhibit less than 20% dispersion when used in an application where the device blocks at least 600V. A combined thickness of all III-N layers can be about 3 microns or less and the device can exhibit less than 20% dispersion when used in an application where the device blocks at least 1200V. The device can include a substrate on an opposite side of the buffer layer from the dispersion blocking layer, wherein the substrate comprises either silicon carbide, sapphire or substantially pure silicon.

One or more of the embodiments described herein may provide one of the following advantages. One solution to prevent current collapse caused by traps in the buffer layer is to grow a thick (>2 um) GaN channel layer to separate the electrons in the 2DEG from the defects in the buffer. However, while this solution can be a suitable approach for transistors grown on silicon carbide or sapphire substrates, it can be difficult to grow thick uninterrupted gallium nitride layers on silicon substrates. Therefore, the devices and methods described herein do not require a thick channel layer. Rather, channel layers with a thickness of less than 0.5 microns, such as less than 0.2 micron can be utilized. In addition to trapping and current collapse, another major challenge in the fabrication of GaN devices is the creation of insulating buffer layers. One or more types of an intentional impurity such as iron (Fe), carbon (C), or magnesium (Mg) may be added to the buffer to compensate unintentional impurities in order to render the buffer semi-insulating. However, the use of intentional impurities must be managed carefully and balanced with the need to reduce current collapse. For example, a standard AlGaN/GaN transistor can be grown in which the entire GaN layer is doped, for example with Fe, except for a thin portion near the AlGaN/GaN interface where the 2-DEG forms. This structure can result in excellent off-state leakage behavior, but can suffer from current collapse as a result of channel charge being trapped by deep levels associated with Fe during device operation. On the other end of the spectrum, an AlGaN/GaN structure can be grown where no intentional Fe doping is used. This structure will have little current collapse behavior, but has high off-state leakage at high voltages.

The solutions provided herein avoid problems occurring in other III-nitride devices, such as problems that occur in devices that offer other solutions, such as merely forming back barriers in cation faced III-nitride devices to confine carriers to the vicinity of the 2DEG. Some back barriers can result in devices exhibiting high dispersion, because the GaN channel layer next to the AlN/AlGaN buffer layer is not of a very high quality and can therefore trap channel charge during device operation. To prevent defects from forming near the device channel, the buffer layer has to be made thick (>0.5 μm). However, a thick high bandgap buffer layer can act as a poor thermal conductor to the substrate, which is undesirable for power devices. Furthermore, a thick AlN/AlGaN buffer layer with the large Al mole fraction (>20%), required to form the barrier to prevent electron entry into the buffer layer, is more difficult to grow. Even if one grows a thick AlGaN layer with Al mole fraction greater that 20%, it is very defected and causes a defected channel layer to be subsequently formed on it. Indium based quaternary III-nitrides produce a small conduction band discontinuity that acts as a back barrier. These schemes can be used in low-voltage applications to improve channel carrier confinement and thence transconductance and output resistance. However, they have limited applicability for high voltage devices, where operating voltages are greater than 100 V, and carrier heating causes electrons to cross these small barriers.

The devices and methods described herein allow for fabrication of III-N devices on various substrates in which dispersion due to buffer layer traps is mitigated. By preventing the trapping of channel electrons in the bulk of the buffer layer, the background doping in the buffer layer can be much higher than would otherwise be practical, leading to a more manufacturable structure. Furthermore, if the channel layer is thin enough, the dopant levels can remain high in the channel layer without significant effect on electrical performance. This allows for the use of dopants (such as Fe in MOCVD) which may "ride" the surface during growth and result in long tails after the dopant source is shut off. The buffer layer is sufficiently insulating. The entire III-N material structure is also sufficiently thin to prevent defects resulting from thermal mismatch between the substrate and the III-N materials from forming. The devices described herein can be used in high voltage applications because they exhibit low trapping and low leakage. They can also be used for high frequency HEMTs to reduce dispersion. By separating the channel from the buffer, the design of optimum buffer layers can be decoupled from the design of the channel structure, resulting in higher performance and a more controllable, repeatable manufacturing process.

BRIEF DESCRIPTION OF DRAWINGS

FIG. 1 is a schematic of a back barrier in GaN based devices showing how a conduction band back barrier can prevent carriers from the channel from getting trapped in the buffer layer.

FIG. 2 shows the general structure of a semiconductor stack with a dispersion blocking layer included.

FIG. 3 shows a cross-section of the semiconductor stack, wherein a dispersion blocking layer is added using a graded AlGaN layer.

FIG. 4 shows a simulated band diagram for a semiconductor stack with a dispersion blocking layer.

FIG. 6 shows the CV and carrier profiles for two semiconductor devices with different compensating schemes below the dispersion blocking layer.

FIG. 7 has graphs showing drain leakage current vs. drain bias when the HEMTs are biased OFF for devices with and without the dispersion blocking layer.

FIG. 8 has graphs of the ON resistance and drain current as a function of the drain voltage.

FIG. 9 shows the schematic cross-section of a semiconductor stack with a dispersion blocking layer on a silicon substrate with a HEMT fabricated on that.

DETAILED DESCRIPTION

Figure 5A:
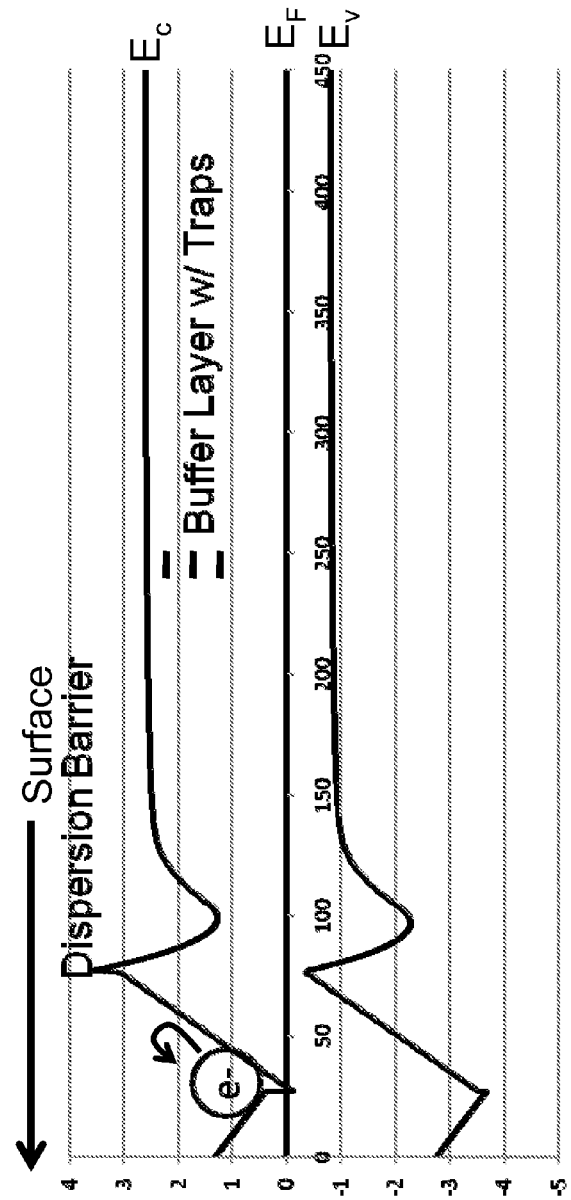
FIG. 5 shows band diagrams that show how the dispersion blocking layer prevents carrier trapping.

Device structures in which a dispersion blocking layer is included between the channel layer and the buffer layer of a III-N semiconductor device confine carriers to the channel layer so that dispersion or current collapse due to trapping in the buffer layer is minimized. The term dispersion blocking layer describes a layered structure in a III-N device that reduces electron trapping in the buffer layer and thence reduces drain current dispersion or drain current collapse and output resistance increase. The terms dispersion and current collapse are used synonymously herein for drain current reduction due to electron trapping. Additionally, the buffer layer can be made sufficiently insulating, such as by intentional doping, to prevent buffer leakage. Dispersion blocking layers can alleviate the need to grow thick channel or buffer layer(s) in order to reduce trapping and current collapse. The blocking layer can further eliminate the need to optimize the trade-off between reducing current collapse and having a low leakage buffer. By inserting a polarization engineered dispersion blocking layer close to the electron channel, electrons are prevented from entering the defective buffer layer, permitting the insulating nature of the buffer layer to be improved. A dispersion blocking layer can be used with GaN devices formed on silicon.

GaN-based materials and foreign substrate materials such as silicon have different lattice constants and different coefficients of thermal expansion. These differences can be addressed in part by using AlGaInN materials in the buffer layer, which may comprise one or more layers for nucleation, stress management and defect reduction, to offset the effect of the lattice mismatch and the effect of the differences in the coefficient of thermal expansion. In addition, for high voltage devices ($V_{DS}$>300V, 600V or 1200V, depending on the application) GaN-based epitaxial material grown on a silicon substrate often has a thickness large enough to prevent breakdown of the device fabricated from the GaN epitaxial material. That is, it is desirable to prevent breakdown along the path from the drain to the silicon to the source. This path is possible because the Si substrate has a higher conductivity and lower breakdown strength than the GaN grown thereon.

The various III-N alloys used to form nucleation and buffer layers to manage the effects of lattice mismatch and the coefficient of thermal expansion are typically very defective because of the lattice mismatch and buffer layer's requirements to accommodate strain due to thermal coefficient mismatch. The channel material grown above the nucleation and buffer layer on which the active high power device is fabricated can be grown as pure and thick as possible to attempt to separate the active channel region in the channel layer from the buffer layer. A thick channel layer can reduce the problems of dispersion and current collapse due to electron trapping in defects. However, the maximum thickness of the high purity III-N channel is limited because of the lattice mismatch and coefficient of thermal expansion problem. Further, a thick channel can lead to excessive bowing of the wafer and can potentially cause the wafer to crack. The use of the III-N dispersion blocking layer can mitigate the need for a thick channel, because the III-N dispersion blocking layer prevents electrons from the channel from interacting with the defects in the buffer layer during device operation. This allows the buffer layer to be designed independent of the channel layer, breaking a design trade-off that can exist. The blocking layer can also allow reduced dispersion operation of high power GaN-based devices fabricated on Si substrates.

Referring to FIG. 2, a substrate 1 is an appropriate substrate, such as silicon carbide, sapphire, silicon, a III-nitride or any other material, for the growth of III-nitride semiconducting layers, including cation-face III-nitride layers, by hetero- or homo-epitaxy. A channel layer 4 and a barrier layer 5 form the active portion of the device, with the bandgap of the barrier layer 5 being larger than that of the channel layer 4. Buffer layer 2 is between the substrate 1 and the channel layer 4. In general, the active portion of the device can include any combination of III-N layers that can be used to form a III-N electronic device, such as a diode, HEMT, HFET, MISHFET, POLFET, or other III-N device. Examples of III-N diode and transistor devices, along with III-N layers which comprise these devices, can be found in U.S. patent application Ser. No. 11/856,687, filed Sep. 17, 2007, U.S. patent application Ser. No. 12/102,340, filed Apr. 14, 2008, U.S. patent application Ser. No. 12/324,574, filed Nov. 26, 2008, U.S. patent application Ser. No. 12/108,449, filed Apr. 23, 2008, U.S. patent application Ser. No. 12/332,284, filed Dec. 10, 2008, U.S. patent application Ser. No. 12/368,248, filed Feb. 9, 2009, and U.S. patent application Ser. No. 11/856,695, filed Sep. 17, 2007, all of which are hereby incorporated by reference.

Buffer layer 2 enables the formation of overlying III-nitride layers. The buffer layer 2 can be a simple layer of a single material or can be formed of multiple layers, such as any combination of $Al_xGa_{1-x}N$/GaN layers. The buffer layer 2 can be lattice mismatched to the substrate. Ideally, the average lattice constant of the lower face of the buffer layer 2 is matched to the substrate 1 and the average lattice constant of the upper face of the buffer layer 2 is matched to the lattice constant of the channel layer. However, this type of lattice matching is difficult to achieve in a defect-free buffer layer 2. Rather, the lattice constant mismatching that realistically occurs between buffer layer 2 and substrate 1 and between buffer layer 2 and channel layer 4 can result in the formation of dislocations and other extended defects which have deep levels. The buffer layer 2 can be intentionally doped, such as with iron (Fe), carbon (C), or magnesium (Mg), to compensate for unintentional n-type dopants, which can cause buffer leakage. The density of deep levels, which can trap channel charge during device operation, can be further increased by the intentional doping to compensate the unintentional dopants in the buffer layer to make it semi-insulating.

Dispersion blocking layer 3 is inserted between the buffer layer 2 and the channel layer 4. The dispersion blocking layer 3 is a thin, such as, less than 500 nm thick, for example, less than 200 nm thick, and if need be compensated, that is, intentionally doped with p-type dopants, layer of a III-nitride material. The dispersion blocking layer 3 is strained such that it is polarized with respect to the channel material. A sheet of negative polarization charge on its upper face creates a field to confine electrons to the upper regions of the channel layer 4 and prevents the electrons from getting trapped in the buffer layer 2. A band-edge discontinuity at the interface of the channel layer 4 and the dispersion blocking layer 3 such that the conduction band minimum is higher in the dispersion blocking layer 3 further helps to reduce electron injection and trapping.

The dispersion blocker layer 3 is essentially a layer, or a combination of layers, which creates a large field and barrier to isolate electrons from traps in the defective buffer layer 2. One way of isolating electrons is to create a large field perpendicular to the plane of the 2DEG that confines electrons to the part of the channel layer 4 that is substantially trap-free so that trapping is, for example less than 10% of the channel charge, during device operation. The field is created by a sheet or layer of negative charge using polarization or delta doping. The field therefore confines electrons to the top of the channel layer. Electrons are isolated by growing a compensated semi-insulating pseudomorphically strained dispersion blocking layer 3, so that polarization creates a sheet of negative charge just below the channel layer. In some cases, a compensated spacer layer is required between the pseudomorphically strained dispersion blocking layer 3 and the buffer layer.

The dispersion blocking layer 3 can be formed of a III-nitride layer of alloys such as a binary alloy AN, or a ternary alloy such as $A_xGa_{1-x}N$ with $0 \le x < 1$, or a quaternary alloy $Z_yA_xGa_{1-x-y}N$ with $0 \le (x+y) < 1$, where A and Z are cationic elements. In some embodiments, these layers are graded from one alloy to the next or the alloys can be stepped within the layer. Two simple examples are: an AlN layer or an $Al_xGa_{1-x}N$ layer, where the latter is graded or stepped in Al composition. The dispersion blocking layer can be an AlGaN/GaN superlattice. The dispersion blocking layer 3 can be intentionally compensated with Fe, Mg, Be, C or Zn or any other suitable dopant or combination of dopants that are able to prevent the formation of a 2DEG or a less confined electron distribution in or below the dispersion blocking layer. The extent of the compensation can be from 0 to 100% depending on the device requirement, the tradeoff being between the advantages of little mobile electrons in or below the dispersion blocking layer 3 and the disadvantage of deep defects due to the intentional compensation doping. The charge due to polarization creates the field that raises the conduction band edge in the portion of the channel layer 4 adjacent to the dispersion blocking layer 3. Furthermore, a III-N spacer layer can be included between the buffer layer 2 and dispersion blocking layer 3 and could be considered part of the dispersion blocking layer 3. In some embodiments, the spacer layer is a III-nitride ternary alloy such as $Al_xGa_{1-x}N$, where $0 \le x < 0.3$. The spacer layer can be compensated, that is, the right amount of the opposite type of dopant is added to make the semiconductor near intrinsic, or overcompensated, that is, the type of material is changed, such as from an n-type material to a p-type material.

An exemplary device having a dispersion blocking layer is shown in schematic in FIG. 3. Substrate 1 is silicon carbide. Buffer layer 2 includes a thin AlN nucleation layer 21 grown on the SiC substrate 1 and an iron doped GaN layer 22 on the nucleation layer. The iron doped GaN layer can be between about 1 and 10 microns thick, such as about 2.5 microns thick. The dispersion blocking layer 3 has a moderately Fe doped GaN spacer layer 31 with a graded $Al_xGa_{1-x}N$ (x going from 0 to 0.23) layer 32 on the spacer layer. The graded $Al_xGa_{1-x}N$ layer is about 27 nm thick. The channel layer 4 is formed of GaN and has a thickness of less than 500 nm, such as about 50 nm. The barrier layer 5 includes a 0.6 nm AlN layer 51 with a 27 nm $Al_{0.28}Ga_{0.72}N$ layer 52 thereon.

Figure 5B:
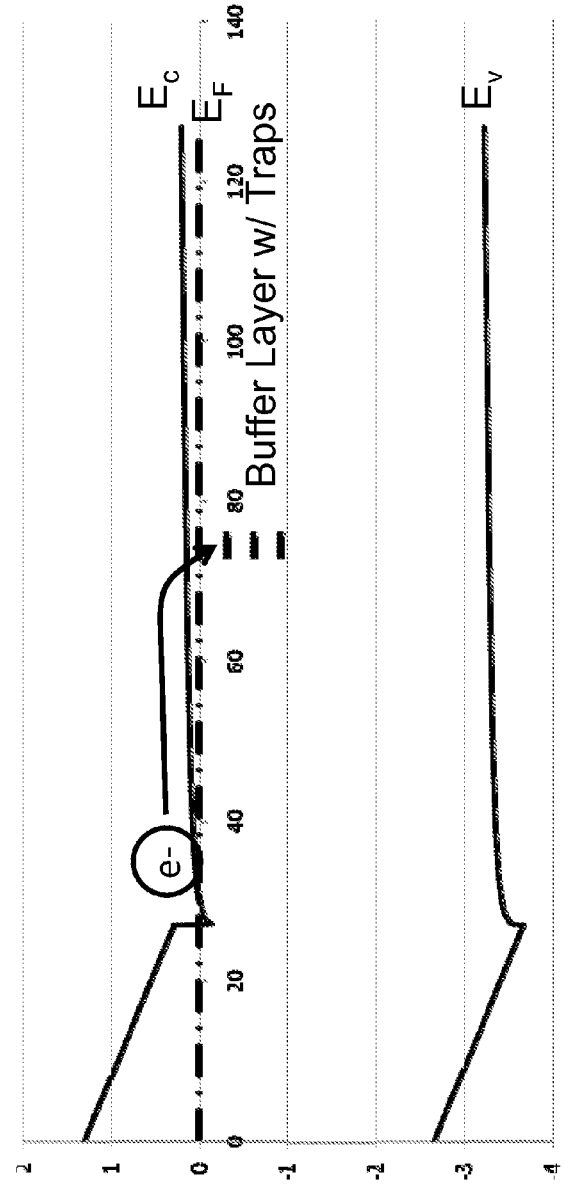

A simulated band diagram for the device shown in FIG. 3 is shown in FIG. 4. The addition of the dispersion blocking layer 3 creates a large field E, which raises the conduction band edge 201 at the bottom face of the channel layer 4. Furthermore, the iron doping can prevent the formation of a 2DEG below the graded AlGaN sublayer of the blocking layer 3. Alternatively, an additional 2DEG or other charge distribution can be present in or below the dispersion blocking layer 3, where the concentration of additional charge can be controlled by adjusting the concentration of iron doping. The band diagrams in FIG. 5 show the difference in the barrier for situations where a device has (FIG. 5(*a*)) and does not have (FIG. 5(*b*)) an AlGaN dispersion blocking layer 3. As shown in the band diagrams, adding a graded AlGaN blocking layer prevents electrons from being scattered into the buffer layer 2 where the electrons can be trapped. FIGS. 6-8, show the effects of introducing an AlGaN dispersion blocking layer. As shown by the graphs, doping the spacer layer such as by Fe doping, can prevent or reduce the formation of a 2DEG below the dispersion blocking layer 3. The elimination of a 2-DEG below the dispersion blocking layer 3 can reduce device leakage or early breakdown for some device structures. Further, the dispersion blocking layer 3 can improve device switching performance.

FIG. 6 shows capacitance-voltage (CV) plots and carrier profiles of two devices with AlGaN dispersion blocking layers. Each carrier profile has two peaks, the peaks $P_1$ and $P_3$ closer to the surface are due to the channel 2DEG and the peaks $P_2$ and $P_4$ are deeper in the semiconductor indicate the electron concentration below the dispersion blocking AlGaN layer. The plots in FIG. 6(*a*) are for a device that has been Fe doped right up to the graded AlGaN layer and the plots in FIG. 6(*b*) are for a device with Fe doping only in the buffer layer. In the latter case a 2DEG layer is formed below the AlGaN dispersion blocking layer, which is shown by P4 being sharper and higher than P2. A 2DEG below the AlGaN dispersion blocking layer can be problematic at large device biases for some device structures.

FIGS. 7 and 8 are performance plots of performance parameters of HEMTs with and without a graded AlGaN dispersion blocking layer. In FIG. 7(*a*), current voltage (IV) plots for devices without dispersion blocking layers are shown and in FIG. 7(*b*) the IV plots for devices with dispersion blocking layers are shown. The plots (each plot is for a different device) show the drain leakage current as a function of drain bias with the devices biased OFF. Devices with a dispersion blocking layer (FIG. 7(*b*)) have on the average smaller leakage currents compared to devices without the dispersion blocking layer (FIG. 7(*a*)).

In FIG. 8 plots of the on resistance ($R_{ON}$), when the FET is switched ON after being turned OFF and kept at a certain drain bias, is shown as a function of the drain voltage when the device is kept OFF. Also plotted is the drain current ($I_{DS}$) used for measuring each $R_{ON}$ and as can be seen the drain currents are around the nominal 1 A value set for these measurements. The $R_{ON}$ after the drain is kept at a certain reverse bias is a measure of trapping that modulates the channel. There is little evidence of trapping in the device with the graded AlGaN dispersion blocking layer (FIG. 8(*b*)). However, the device without the dispersion blocking layer (FIG. 8(*a*)) shows a steady increase of trapping effects, exemplified by the increase of $R_{ON}$, as the drain voltage is increased.

FIG. 9 shows a cross-section of a GaN-on-Si depletion mode (D-mode) HEMT that has a dispersion blocking layer. On a silicon substrate 1, a III-nitride buffer layer 2 is grown heteroepitaxially. Next, a dispersion blocking layer 3 either with or without a GaN spacer layer is grown on the buffer layer 2. The channel layer 4 and the barrier layer 5 are grown on the blocking layer 3. A D-mode HEMT is fabricated by patterning and forming ohmic source 6 and drain 9 contacts, depositing a suitable dielectric 8 and appropriately micromachining the dielectric 8 before depositing the gate 7 and the slant field plate on the dielectric 8. The device is optionally coated with a passivation layer (not shown) that is patterned to open contact holes for wire bonding or flip-chip bonding to bond pads. This D-mode HEMT is illustrated as an example of how a dispersion blocking layer could be used in a planar GaN device. E-mode HEMTs, diodes or even GaN integrated circuits can benefit from such dispersion blocking layers.

A number of embodiments of the invention have been described. Nevertheless, it will be understood that various modifications may be made without departing from the spirit and scope of the invention. For example, the dispersion blocking layer could have different types of buffer and active layers on either side, the buffer layer optimized for the substrate and the III-nitride active layer so that the latter have the requisite strain profile and low defect density, and the active layers themselves optimized for the FET, diode or high voltage integrated circuit fabricated in them. The specific HEMT structure and measurements on it that are presented are meant only to show the efficacy of the dispersion blocking layer. The structures described herein can be grown by epitaxy, such as by MBE or HVPE. Although the term "on" is used in the claims to indicate the relative locations of some of the components, such as layers, there may be one or more intervening layers. When the term "directly on" is used, there is no intervening layer. Accordingly, other embodiments are within the scope of the following claims.

What is claimed is:

1. A III-N device, comprising:
   a buffer layer;
   a first III-N material layer on the buffer layer;
   a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer; and
   a dispersion blocking layer between the buffer layer and the channel layer; wherein
   a sheet or a distribution of negative charge at an interface of the channel layer and the dispersion blocking layer confines electrons away from the buffer layer;
   a band-edge discontinuity at the interface of the channel layer and the dispersion blocking layer results in a conduction band edge directly adjacent to the interface being higher in the dispersion blocking layer than in the channel layer;
   a conduction band minimum of the dispersion blocking layer is within the dispersion blocking layer and away from the interface; and
   the dispersion blocking layer is doped with Fe, Mg, Be, C, or Zn.

2. A III-N device, comprising:
   a buffer layer;
   a first III-N material layer on the buffer layer;
   a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer;
   a dispersion blocking layer between the buffer layer and the channel layer; and
   a spacer layer between the dispersion blocking layer and the buffer layer; wherein
   a sheet or a distribution of negative charge at an interface of the channel layer and the dispersion blocking layer confines electrons away from the buffer layer;
   a band-edge discontinuity at the interface of the channel layer and the dispersion blocking layer results in a conduction band edge directly adjacent to the interface being higher in the dispersion blocking layer than in the channel layer; and
   a conduction band minimum of the dispersion blocking layer is within the dispersion blocking layer and away from the interface.

3. The device of claim 2, wherein the dispersion blocking layer has a greater concentration of aluminum than the spacer layer.

4. The device of claim 2, wherein the channel layer consists of a first III-nitride alloy and the spacer layer consists of a second III-nitride alloy, wherein the first III-nitride alloy and the second III-nitride alloy have aluminum mole fractions within 10% of one another.

5. The device of claim 2, wherein the spacer layer consists of $Al_xGa_{1-x}N$, $0 \leq x < 0.3$.

6. A III-N device, comprising:
   a buffer layer;
   a first III-N material layer on the buffer layer;
   a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer; and
   a dispersion blocking layer between the buffer layer and the channel layer; wherein
   a sheet or a distribution of negative charge at an interface of the channel layer and the dispersion blocking layer confines electrons away from the buffer layer;
   a band-edge discontinuity at the interface of the channel layer and the dispersion blocking layer results in a conduction band edge directly adjacent to the interface being higher in the dispersion blocking layer than in the channel layer;
   a conduction band minimum of the dispersion blocking layer is within the dispersion blocking layer and away from the interface; and
   the dispersion blocking layer comprises $Al_xIn_yGa_{1-x-y}N$, $y < x$ and $0 < (x+y) < 1$.

7. The device of claim 6, wherein the dispersion blocking layer is configured to confine electrons to the channel layer during device operation.

8. The device of claim 6, wherein a portion of the dispersion blocking layer that is closer to the channel layer than the buffer layer has a higher aluminum composition than a portion of the dispersion blocking layer that is closer to the buffer layer.

9. The device of claim 8, wherein the dispersion blocking layer has a graded aluminum concentration.

10. The device of claim 8, wherein the dispersion blocking layer has a stepped aluminum concentration.

11. The device of claim 6, further comprising a source contact, a drain contact and a gate, wherein the gate is adjacent to the second III-N material layer, the source contact and drain contact are in electrical contact with the 2DEG and the device is an enhancement mode FET.

12. The device of claim 6, further comprising a source contact, a drain contact and a gate, wherein the gate is in contact with the second III-N material layer, the source contact and drain contact are in electrical contact with the 2DEG and the device is a depletion mode FET.

13. The device of claim 6, wherein the first and second III-N material layers are part of a III-nitride stack, and the device further comprises an anode that forms a Schottky barrier with the III-nitride stack and a cathode in electrical contact with the 2DEG, wherein the device is a diode.

14. The device of claim 6, wherein the device in operation has an on-resistance increase under switching operation at voltages above 300V that is less than 10%.

15. The device of claim 14, wherein the device in operation has an on-resistance increase that is less than 5%.

16. The device of claim 14, wherein the device in operation has an on-resistance increase under switching operation at voltages above 1200V that is less than 5%.

17. The device of claim 6, wherein the channel layer has a thickness less than 1 micron.

18. The device of claim 17, wherein the channel layer has a thickness less than 0.5 micron.

19. The device of claim 18, wherein the channel layer has a thickness less than 0.05 micron.

20. The device of claim 6, wherein a combined thickness of all III-N layers in the device is about 2 μm or less and the device exhibits less than 20% dispersion when used in an application where the device blocks at least 300V.

21. The device of claim 6, wherein a combined thickness of all III-N layers in the device is about 2.5 μm or less and the device exhibits less than 20% dispersion when used in an application where the device blocks at least 600V.

22. The device of claim 6, wherein a combined thickness of all III-N layers in the device is about 3 μm or less and the device exhibits less than 20% dispersion when used in an application where the device blocks at least 1200V.

23. The device of claim 6, further comprising a substrate on an opposite side of the buffer layer from the dispersion blocking layer, wherein the substrate comprises either silicon carbide, sapphire or substantially pure silicon.

24. An integrated circuit comprising:
the device of claim 6, wherein the device is an enhancement mode transistor or a depletion mode transistor; and
at least one of a diode, resistor or capacitor electrically connected to the device of claim 6.

25. A III-N device, comprising:
a buffer layer;
a first III-N material layer on the buffer layer;
a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer; and
a dispersion blocking layer between the buffer layer and the channel layer; wherein
a sheet or a distribution of negative charge at an interface of the channel layer and the dispersion blocking layer confines electrons away from the buffer layer;
a band-edge discontinuity at the interface of the channel layer and the dispersion blocking layer results in a conduction band edge directly adjacent to the interface being higher in the dispersion blocking layer than in the channel layer;
a conduction band minimum of the dispersion blocking layer is within the dispersion blocking layer and away from the interface;
the dispersion blocking layer is a ternary III-nitride alloy layer with a sheet or layer of negative polarization charge adjacent to the channel layer; and
the composition of the ternary III-nitride alloy layer is graded and the ternary III-nitride alloy layer is doped with Fe, C, Mg, Zn or Be.

26. A III-N device, comprising:
a buffer layer;
a first III-N material layer on the buffer layer;
a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer; and
a dispersion blocking layer between the buffer layer and the channel layer; wherein
a sheet or a distribution of negative charge at an interface of the channel layer and the dispersion blocking layer confines electrons away from the buffer layer;
a band-edge discontinuity at the interface of the channel layer and the dispersion blocking layer results in a conduction band edge directly adjacent to the interface being higher in the dispersion blocking layer than in the channel layer;
a conduction band minimum of the dispersion blocking layer is within the dispersion blocking layer and away from the interface; and
the dispersion blocking layer is doped with Fe, C, Mg, Zn or Be or any combination of acceptor or amphoteric dopants.

27. A III-N device, comprising:
a buffer layer;
a first III-N material layer on the buffer layer;
a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer;
a dispersion blocking layer between the buffer layer and the channel layer; and
a spacer layer that is doped with Fe, C, Mg, Zn or Be or any combination of acceptor or amphoteric dopants; wherein
a sheet or a distribution of negative charge at an interface of the channel layer and the dispersion blocking layer confines electrons away from the buffer layer;
a band-edge discontinuity at the interface of the channel layer and the dispersion blocking layer results in a conduction band edge directly adjacent to the interface being higher in the dispersion blocking layer than in the channel layer;
a conduction band minimum of the dispersion blocking layer is within the dispersion blocking layer and away from the interface;
the dispersion blocking layer is a ternary III-nitride alloy layer with a sheet or layer of negative polarization charge adjacent to the channel layer.

28. A III-N device, comprising:
a buffer layer;
a first III-N material layer on the buffer layer;
a second III-N material layer on the first III-N material layer on an opposite side from the buffer layer, wherein the first III-N material layer is a channel layer and a compositional difference between the first III-N material layer and the second III-N material layer induces a 2DEG channel in the first III-N material layer; and
a dispersion blocking layer between the buffer layer and the channel layer; wherein a sheet or a distribution of negative charge at an interface of the channel layer and the dispersion blocking layer confines electrons away from the buffer layer;

the dispersion blocking layer has a wider bandgap than the channel layer;

a conduction band minimum of the dispersion blocking layer is within the dispersion blocking layer and away from the interface; and the dispersion blocking layer is doped with Fe, C, Mg, Zn or Be.

29. The device of claim 28, wherein the dispersion blocking layer comprises $Al_xGa_{1-x}N$.

30. The device of claim 29, wherein the dispersion blocking layer has a graded Al composition.

31. The device of claim 28, further comprising a spacer layer between the dispersion blocking layer and the buffer layer.

32. The device of claim 31, wherein the spacer layer is doped with Fe, C, Mg, Zn or Be.

33. A nitride-based device, comprising:

a buffer layer;

a first nitride-based material layer on the buffer layer;

a second nitride-based material layer on the first nitride-based material layer on an opposite side from the buffer layer, wherein the first nitride-based material layer is a channel layer and a compositional difference between the first nitride-based material layer and the second nitride-based material layer induces a 2DEG channel in the first nitride-based material layer;

a dispersion blocking layer between the buffer layer and the channel layer; wherein the dispersion blocking layer is strained to induce a sheet or a distribution of negative charge at an interface of the channel layer and the dispersion blocking layer; and a conduction band minimum of the dispersion blocking layer is within the dispersion blocking layer and away from the interface.

* * * * *

UNITED STATES PATENT AND TRADEMARK OFFICE
CERTIFICATE OF CORRECTION

PATENT NO.        : 8,742,459 B2  
APPLICATION NO.   : 12/465968  
DATED             : June 3, 2014  
INVENTOR(S)       : Mishra et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 430 days.

Signed and Sealed this
Eighteenth Day of August, 2015

Michelle K. Lee
*Director of the United States Patent and Trademark Office*